United States Patent
Chen et al.

(10) Patent No.: US 9,741,685 B2
(45) Date of Patent: Aug. 22, 2017

(54) METHODS FOR DIRECTLY BONDING SILICON TO SILICON OR SILICON CARBIDE TO SILICON CARBIDE

(71) Applicant: Lam Research Corporation, Fremont, CA (US)

(72) Inventors: Jihong Chen, Cincinnati, OH (US); Jiuan Wei, Springboro, OH (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/207,933

(22) Filed: Jul. 12, 2016

(65) Prior Publication Data

US 2017/0040284 A1 Feb. 9, 2017

Related U.S. Application Data

(60) Provisional application No. 62/202,364, filed on Aug. 7, 2015.

(51) Int. Cl.
| | |
|---|---|
| *H01L 21/00* | (2006.01) |
| *H01L 23/00* | (2006.01) |
| *H01L 25/00* | (2006.01) |
| *H01L 25/065* | (2006.01) |

(52) U.S. Cl.
CPC .............. *H01L 24/83* (2013.01); *H01L 24/75* (2013.01); *H01L 25/0657* (2013.01); *H01L 25/50* (2013.01); *H01L 2224/7555* (2013.01); *H01L 2224/75265* (2013.01); *H01L 2224/83203* (2013.01); *H01L 2224/83895* (2013.01); *H01L 2924/10253* (2013.01); *H01L 2924/10272* (2013.01)

(58) Field of Classification Search
None
See application file for complete search history.

(56) References Cited

U.S. PATENT DOCUMENTS

| | | | | |
|---|---|---|---|---|
| 5,603,779 A | * | 2/1997 | Linn | H01L 21/2007 148/DIG. 12 |
| 5,683,028 A | * | 11/1997 | Goela | B23K 1/19 228/121 |
| 6,645,831 B1 | * | 11/2003 | Shaheen | H01L 21/187 257/E21.088 |

(Continued)

OTHER PUBLICATIONS

Green et al., "Perry's chemical engineers' handbook", p. 2-23, New York : McGraw-Hill, 2008, ISBN: 0071601503 , 0071422943 (print) , 9780071422949.*

(Continued)

*Primary Examiner* — Sitaramarao S Yechuri

(57) ABSTRACT

A method for bonding a first silicon part to a second silicon part includes arranging the first silicon part and the second silicon part in direct physical contact on a surface in a thermal insulating structure; controlling pressure in the thermal insulating structure to a predetermined pressure; controlling temperature in the thermal insulating structure to a predetermined temperature using one or more heaters; and bonding the first silicon part and the second silicon part during a process period. The predetermined temperature is in a temperature range that is greater than or equal to 1335° C. and less than 1414° C.

27 Claims, 5 Drawing Sheets

(56) References Cited

U.S. PATENT DOCUMENTS

| | | | | |
|---|---|---|---|---|
| 7,732,301 B1* | 6/2010 | Pinnington | ......... | H01L 21/2654 |
| | | | | 257/E21.097 |
| 2009/0298258 A1* | 12/2009 | de Souza | .............. | H01L 21/187 |
| | | | | 438/455 |
| 2010/0304151 A1* | 12/2010 | Tuennermann | ....... | C03B 23/203 |
| | | | | 428/428 |
| 2011/0133295 A1* | 6/2011 | Fujii | ................... | G01P 15/0802 |
| | | | | 257/415 |
| 2012/0100318 A1* | 4/2012 | Danzl | ................... | H01L 21/187 |
| | | | | 428/34.1 |
| 2012/0244679 A1* | 9/2012 | Oka | ...................... | H01L 21/302 |
| | | | | 438/458 |
| 2014/0264374 A1* | 9/2014 | Hecht | .............. | H01L 21/02529 |
| | | | | 257/77 |

OTHER PUBLICATIONS

Collins English Dictionary, Harper Collins Publishers, London, UK, 2014.*

* cited by examiner

METHODS FOR DIRECTLY BONDING SILICON TO SILICON OR SILICON CARBIDE TO SILICON CARBIDE

CROSS-REFERENCE TO RELATED APPLICATIONS

This application claims the benefit of U.S. Provisional Application No. 62/202,364, filed on Aug. 7, 2015. The entire disclosure of the application referenced above is incorporated herein by reference.

FIELD

The present disclosure relates to systems and methods for directly bonding silicon parts together or silicon carbide parts together.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor processing systems may include components that need to be made of silicon (Si) or silicon carbide (SiC). Large components that are made using silicon or silicon carbide are expensive to manufacture. The cost to produce starting blanks for manufacturing these large components increases with finished part dimensions. When using silicon, the starting blanks are typically made from single crystal, dislocation free (DF) silicon ingots and multi-crystalline silicon ingots that are sliced to a required thickness.

In many cases, the machining process is time consuming and has high labor cost. Some components may require large amounts of material to be removed from the starting blank. Some components (such as a gas distribution plate with an internal plenum) are impossible to make using a monolithic silicon blank. Core drilling and electrical discharge machining (EDM) are effective approaches for reducing material loss and machining time for certain types of components such as ring-shaped components. Larger components can be assembled using two or more smaller components that are machined separately and then bonded together. This approach can significantly lower manufacturing costs as compared to machining the equivalent part from a single, monolithic blank.

Elastomers have been used to bond silicon to silicon, silicon to graphite, and silicon to aluminum. However, the elastomer bond has relatively weak tensile strength (typically about ~470 psi). The use of elastomer also limits the working temperature to about 185° C. The elastomer bond typically has higher resistivity and lower thermal conductivity than bulk silicon. The elastomer bond is also prone to generate particle contamination in substrate processing systems.

Liquid phase bonding involves arranging a bonding agent such as aluminum or gold between the two or more parts to be bonded together. The bonding agent is heated above its melting temperature. While the bonds are typically strong, the maximum application temperature is limited by the eutectic temperature of Si and the bonding agent, which is 580° C. for Si—Al and 363° C. for Si—Au, which may be too low for some substrate processing system applications. Additionally, the bonding agent may increase metallic contamination and generate non-volatile particles during subsequent use in substrate processing systems. In addition to contamination risk, coefficient of thermal expansion (CTE) between Si and the bond materials is typically different which can cause shear stress in Si and weaken the bonded part mechanical strength.

SUMMARY

A method for bonding a first silicon part to a second silicon part includes arranging the first silicon part and the second silicon part in direct physical contact on a surface in a thermal insulating structure; controlling pressure in the thermal insulating structure to a predetermined pressure; controlling temperature in the thermal insulating structure to a predetermined temperature using one or more heaters; and bonding the first silicon part and the second silicon part during a process period. The predetermined temperature is in a temperature range that is greater than or equal to 1335° C. and less than 1414° C.

In other features, the pressure in the thermal insulating structure is less than 1 Torr. The process period is between 10 hours and 50 hours. The method further includes supplying an inert gas to the thermal insulating structure during the bonding.

In other features, a bond that is formed between the first silicon part and the second silicon part is capable of withstanding a working temperature during usage that is greater than 580° C. A bond that is formed between the first silicon part and the second silicon part is capable of withstanding working temperatures during usage that are greater than 580° C. and less than 1335° C.

In other features, the method includes supplying external force to hold the first silicon part to the second silicon part during the bonding. A bond that is formed between the first silicon part and the second silicon part has a thermal conductivity of 1.17+/−0.09 W/cm-K. A bond that is formed between the first silicon part and the second silicon part has a tensile strength greater than 2000 PSI.

In other features, the method further includes arranging a carbon material between the surface and at least one of the first silicon part and the second silicon part. The carbon material is selected from a group consisting of graphite and grafoil. The external force is supplied by one of a press and a weight.

In other features, the method includes arranging a carbon material between one of the press and the weight and at least one of the first silicon part and the second silicon part. The first silicon part and the second silicon are bonded together without using an intervening bonding material. A bond that is formed between the first silicon part and the second silicon part is a silicon-silicon covalent bond.

In other features, heat flows into the first silicon part and the second silicon part from sides thereof to centers thereof. Outside surface melting occurs in bonding areas during the process period. Capillary forces at a joint between the first silicon part and the second silicon part draws molten silicon into a gap between the first silicon part and the second silicon part. Upon solidification, silicon parts are bonded together.

In other features, the first silicon part and the second silicon part are made of single crystalline silicon. The first silicon part and the second silicon part are made of multi-crystalline silicon. The first silicon part and the second silicon part are arranged on a susceptor in the thermal insulating structure. The susceptor includes a bottom surface and side walls. The heater is arranged between the side walls and the thermal insulating structure.

A method for bonding a first silicon carbide part to a second silicon carbide part, includes arranging the first silicon carbide part and the second silicon carbide part in direct physical contact in a container; surrounding the first silicon carbide part and the second silicon carbide part in a silicon carbide/silicon powder matrix; arranging the container in a thermal insulating structure; controlling pressure in the thermal insulating structure to a predetermined pressure; controlling temperature in the thermal insulating structure to a predetermined temperature using one or more heaters; and bonding the first silicon carbide part and the second silicon carbide part during a process period. The predetermined temperature is in a temperature range that is greater than or equal to 1600° C. and less than 2000° C.

In other features, the pressure in the thermal insulating structure is less than 1 Torr. The process period is between 10 hours and 50 hours. The method includes supplying an inert gas to the thermal insulating structure during the bonding at a pressure less than 1 atmospheric pressure. A bond that is formed between the first silicon carbide part and the second silicon carbide part is capable of withstanding working temperatures during usage that are greater than 580° C. and less than 1600° C.

In other features, the first silicon carbide part and the second silicon carbide part are bonded together without using an intervening bonding material. A bond that is formed between the first silicon carbide part and the second silicon carbide part is a Si—C covalent bond.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
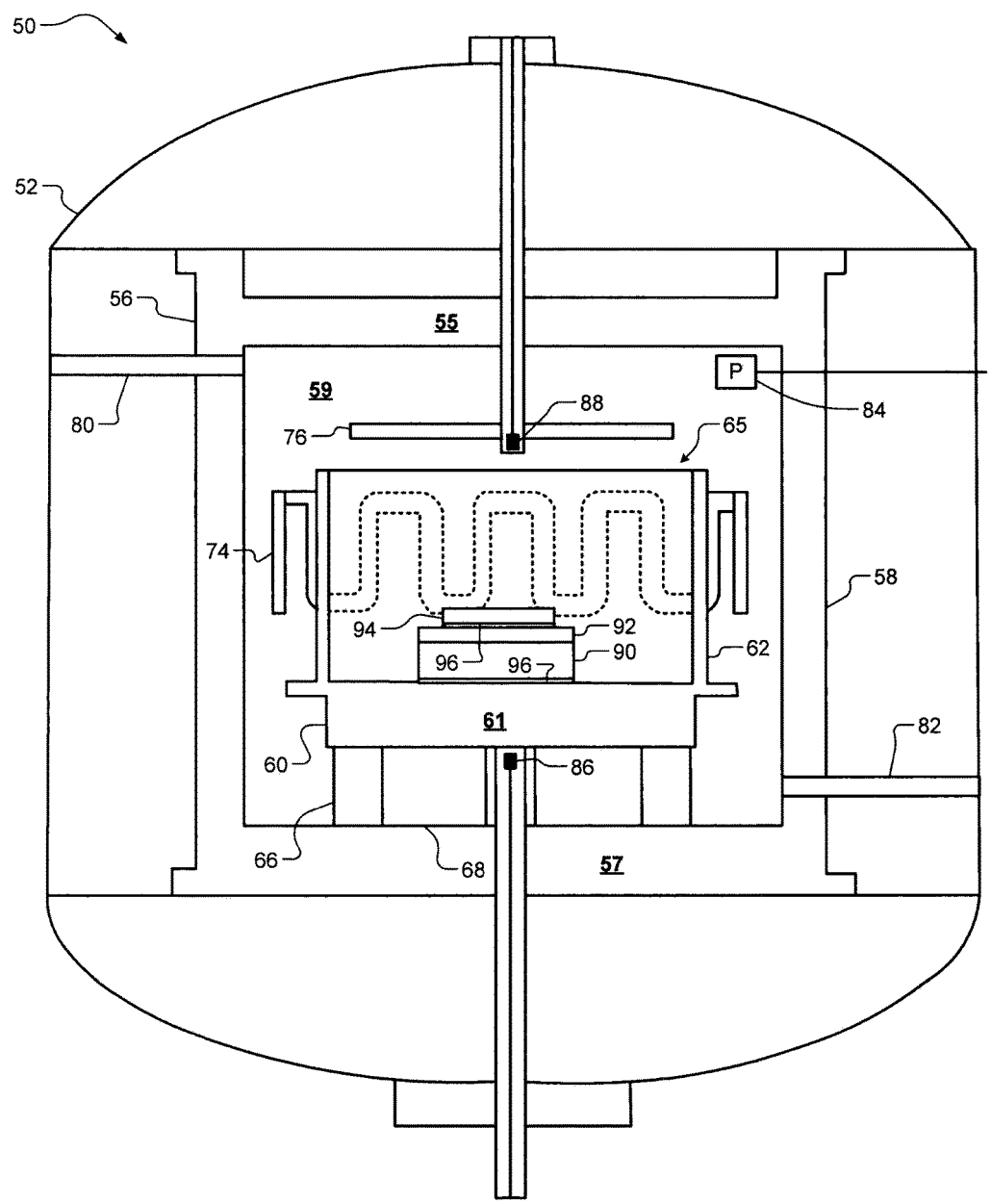
FIG. 1 is a functional block diagram of an example of a bonding apparatus for bonding silicon parts according to the present disclosure.

Referring now to FIGS. 1-4, examples of a bonding apparatus 50 are shown. In FIG. 1, the bonding apparatus 50 is shown to include a housing 52. A thermal insulating structure 56 is arranged inside of the housing 52. The thermal insulating structure 56 includes a bottom portion 57 and one or more side walls 58 that define an inner cavity 59. A top portion 55 may be removable and/or include an opening (not shown).

A susceptor 60 is arranged in the inner cavity 59 of the thermal insulating structure 56. The susceptor 60 includes a bottom portion 61 and one or more side walls 62 that define an inner cavity 65 to receive parts to be bonded. In some examples, the susceptor 60 is made of graphite and has a cylindrical or cubicle cross-section, although other materials and/or cross-sections may be used. One or more supports 66 may be attached to or extend from the susceptor 60 to a bottom surface 68 of the inner cavity 59 of the thermal insulating structure 56. The supports 66 locate the susceptor 60 in a position that is spaced from the bottom surface 68.

One or more heaters 74 may be arranged around an outer periphery of the side walls 62 of the susceptor 60. The heater 74 may be spaced by a predetermined gap from the susceptor 60. Likewise, a heater 76 may be arranged a predetermined distance above a top surface of the susceptor 60. Additional heaters (not shown) may be arranged adjacent to the bottom surface of the susceptor 60. In some examples, the heaters 74 and 76 may have linear, spiral, coiled, or "S"-shaped configurations, although other configurations may be used.

Gas may be supplied to the inner cavity 59 of the thermal insulating structure 56 by a gas inlet 80. Gas and other reactants may be evacuated from the inner cavity 59 of the thermal insulating structure 56 by a gas outlet 82. In some examples, an inert gas such argon (Ar), helium (He) or molecular nitrogen ($N_2$) or their forming gas such as $Ar/H_2$, $N_2/H_2$, may be supplied to the inner cavity 59 of the thermal insulating structure 56 during the bonding process. A pressure sensor 84 may be arranged in the inner cavity 59 to measure pressure in the inner cavity 59. Thermocouples 86 and 88 may be used to sense one or more temperatures in the inner cavity 59 of the thermal insulating structure 56.

In use, parts 90 and 92 that are made of silicon may be arranged in direct contact and placed in the inner cavity 65 of the susceptor 60. In some examples, a press 94 such as a weight may be used to supply external force to hold the parts together. In other examples, the weight of one of the parts may be used to hold the parts together. In some examples, an external force of 0.01 MPa-10 Mpa may be used for Si—Si direct bonding using either the press 94 or the weight of one or more of the parts to be bonded.

In some examples, the systems and methods described herein create a silicon (Si) to Si bond to connect the parts together without the use of foreign intervening materials such as elastomer or a liquid bonding agent. In some examples, the method includes using the press 94 to hold the parts together. In some examples, the external force is proportional to the surface area to be bonded. The parts are heated to a predetermined temperature in vacuum for a predetermined bonding period. In some examples, a covalent bond is created between the parts.

In some examples, the silicon parts are heated to a temperature within 6% of the melting point. Heat flows in from sides of the parts to a center of the parts which leads to localized outside surface melting. Capillary forces pull the melt into the gap between the two parts and bond them together. Because the materials of the parts are the same and there is no additional material used, the resulting component has extremely high purity. Contamination during subsequent use in substrate processing systems is reduced as compared to parts bonded using elastomers or liquid bonding agents. In addition, there is no CTE mismatch induced shear stress in the bonded part.

In some examples, the pressure in the bonding apparatus is less than 1 Torr without inert gas being used. In some examples, the pressure in the bonding apparatus is less than 1 atmosphere when inert gas is used. In some examples, the process temperature is greater than or equal to 1335° C. and less than 1414° C. (the melting temperature of the silicon). In some examples, the process period is between 10 and 50 hours.

In some examples, a carbon material 96 is used between the silicon parts and external fixtures such as the susceptor 60 and/or the press 94. In some examples, the carbon material 96 includes graphite or grafoil, although other materials may be used.

The bond created by the systems and methods disclosed herein has tensile strength exceeding 2000 psi. The resistivity of the bond is equivalent to bulk silicon. The thermal conductivity of the bond (1.17+/−0.09 W/cm-K) is equivalent to bulk silicon (1.18-1.20 W/cm-K). For the parts have with the same resistivity and carrier type, the bond will have the same resistivity and carrier type. For the parts with different carrier type, the bond will have a higher resistivity than both parts and p-n junction may be formed.

In addition, the systems and methods described herein enable high working temperatures (for example greater than 1000° C.) that are useful for substrate processing systems. For example only, the bond components can be used in areas directly facing halogen-based plasma.

Figure 2:
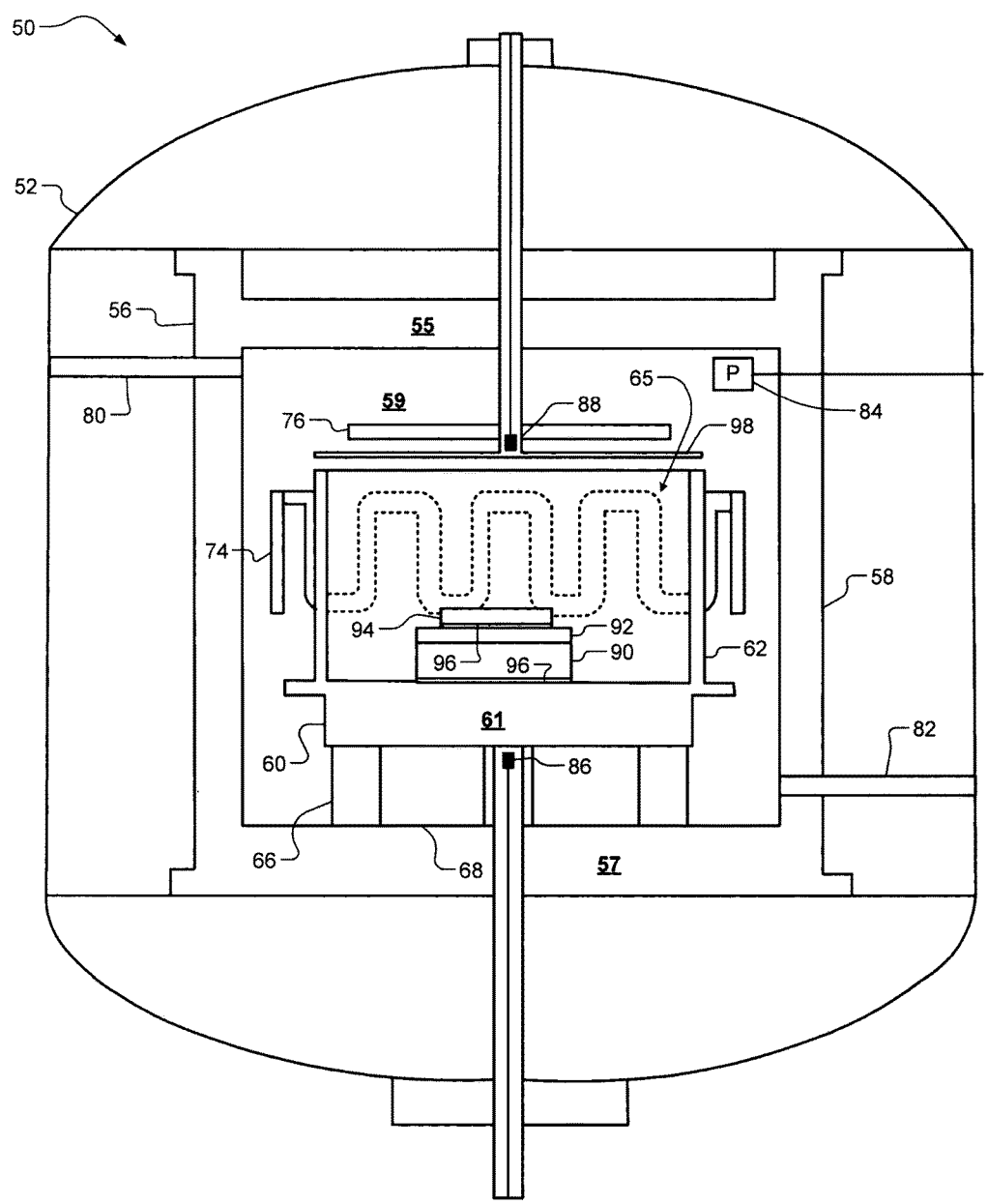
FIGS. 2-4 are functional block diagrams of other examples of a bonding apparatus for bonding silicon parts or silicon carbide parts according to the present disclosure.
Figure 3:
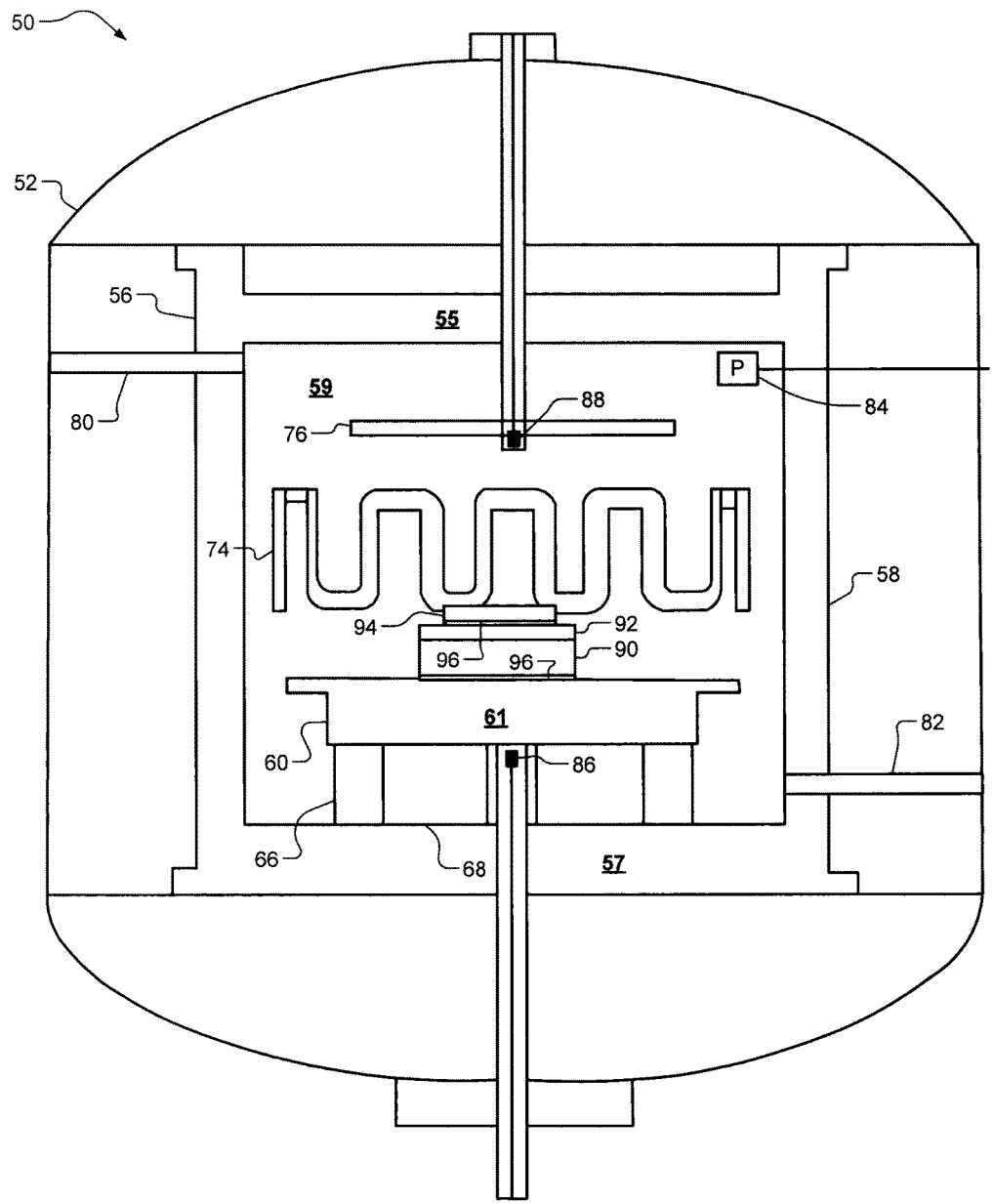

In FIG. 2, a susceptor cover 98 may be used to cover an opening of the inner cavity 65 of the susceptor 60. In FIG. 3, the susceptor 60 may be used without the susceptor cover 98 and the side walls 62.

Figure 4:
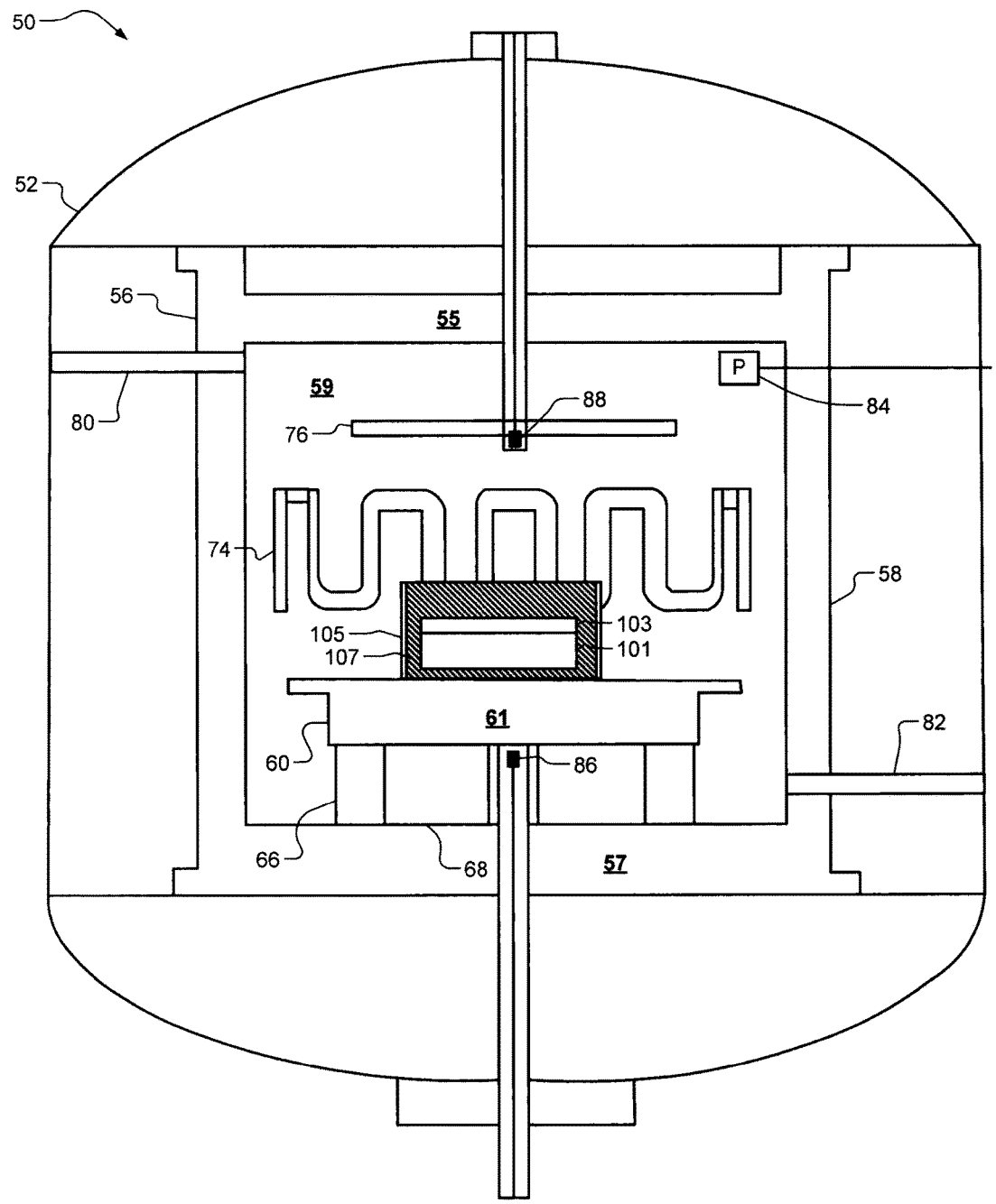

In FIG. 4, a similar approach is used to bond two or more parts made of silicon carbide (SiC) together. For example, a first SiC part 101 is bonded to a second SiC part 103. In some examples, the first SiC part 101 and the second SiC part 103 are arranged in direct contact in a container 105 with a SiC/Si powder matrix 107 surrounding the first SiC part 101 and the second SiC part 103. The SiC/Si powder matrix 107 reduces sublimation that may adversely impact the bond that is formed. The first SiC part 101 and the second SiC part 103 are heated to a temperature range between 1600° C. to 2000° C. In some examples, similar pressures described above may be used. In some examples, an inert gas such as Ar at sub atmospheric pressure may be used.

Figure 5:
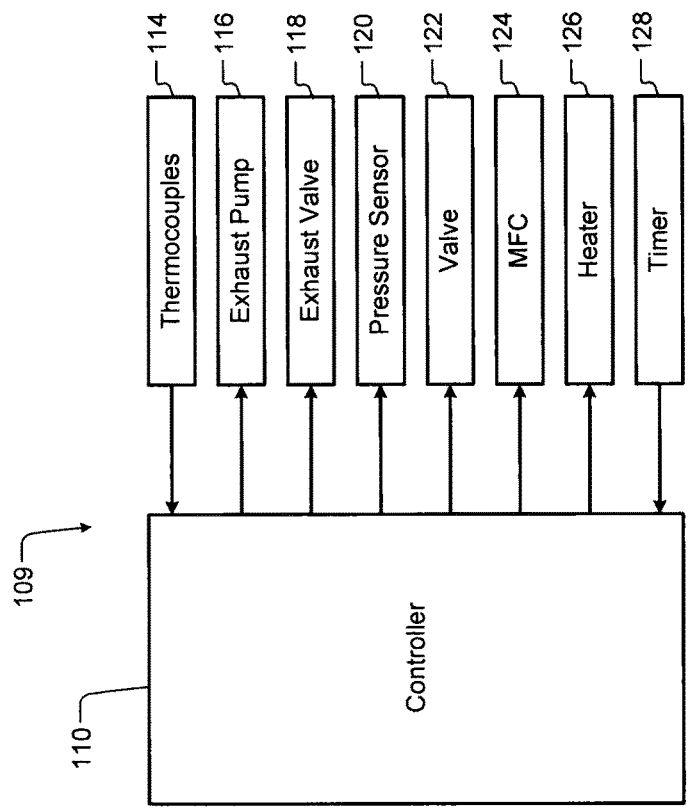
FIG. 5 is a functional block diagram of an example of a controller for controlling bonding of silicon parts according to the present disclosure.

Referring now to FIG. 5, a control system 109 may be used to control operation of the bonding apparatus 50 during bonding of parts. The control system 109 includes a controller 110 that communicates with thermocouples 114 (such as thermocouples 86 and 88) to monitor temperatures within the inner cavity 59. The controller 110 may also communicate with an exhaust pump 116 and an exhaust valve 118 to create vacuum pressure and/or to evacuate the inner cavity 59.

The controller 110 may communicate with a pressure sensor 120 to control pressure inside of the inner cavity 59. Inert gas may be supplied to the inner cavity 59 of the thermal insulating structure 56 using one or more valves 122 and one or more mass flow controllers (MFCs) 124. The controller 110 may communicate with one or more heaters 126 (such as the heaters 74 and 76 in FIGS. 1 and 2) to control the temperature in the bonding apparatus 50 during bonding. The controller 110 may communicate with an internal timer (not shown) or an external timer 128 to determine the predetermined bonding period.

Figure 6:
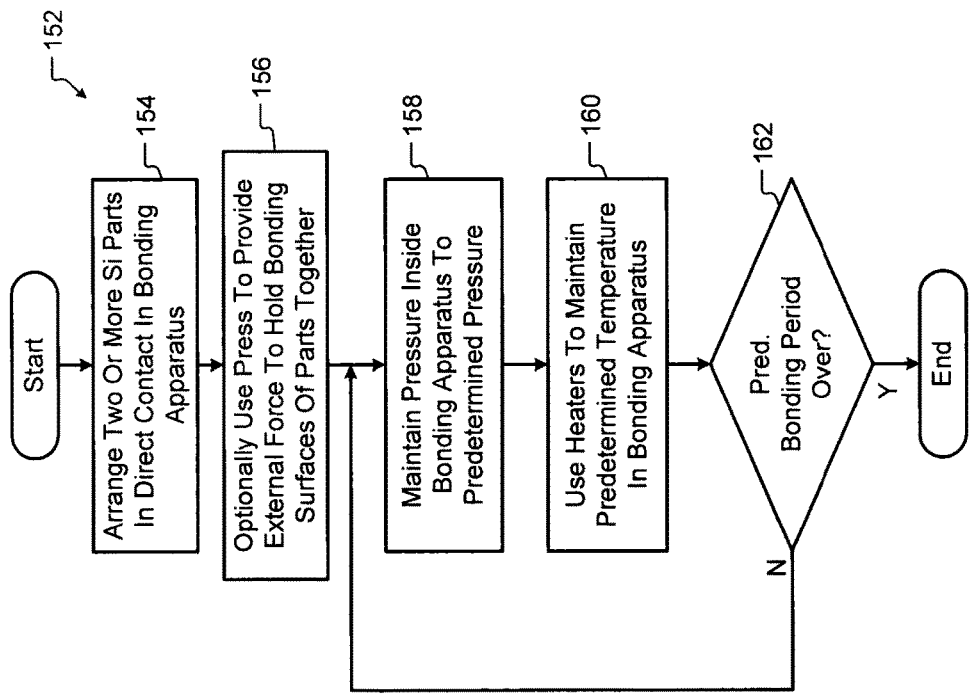
FIG. 6 is a flowchart of an example of a method for bonding silicon parts.

Referring now to FIG. 6, a method 152 for bonding parts together is shown. At 154, two or more parts are arranged in direct contact in the bonding apparatus. In the case of silicon carbide parts, the SiC parts are arranged in the SiC/Si powder matrix in the container. At 156, a press may be used to provide external force to hold bonding surfaces of the two or more parts together. At 158, pressure is maintained at a predetermined pressure inside the bonding apparatus. At 160, heaters maintain a predetermined temperature in the bonding apparatus during bonding. At 162, the method determines whether the predetermined bonding period is over. If not, the method returns to 158. Otherwise, the method ends.

The silicon or silicon carbide bonds formed using the systems and methods described herein are Si—Si or Si—C covalent bonds. The bond does not involve foreign material such as oxygen, hydrogen, or metal as a bonding agent. The bond also does not involve weak van der Waals forces, hydrogen bonds, anodic bonds, or adhesive force.

The systems and methods described herein disclose bonding near a melting point of silicon or silicon carbide using a bonding apparatus with a low temperature gradient. The systems and methods described herein provide high purity silicon or silicon carbide having desired physical properties. The systems and methods described herein provide additional flexibility during design and manufacturing of components used in substrate processing systems.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, the controller may control various components or subparts of the system. The controller, depending on the processing requirements and/or the type of system, may be programmed to control any of the processes disclosed herein, including the delivery of processing gases, temperature settings (e.g., heating and/or cooling), pressure settings, heat settings, vacuum settings, power settings, flow rate settings, positional and operation settings.

The controller may be defined as electronics having various integrated circuits, processors, logic, memory, and/or software that receive instructions, issue instructions, control operation, monitor measured parameters, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process onto a system. The operational parameters may, in some embodiments, be part of a recipe defined by process engineers to accomplish one or more processing steps during the bonding.

The controller, in some implementations, may be a part of or coupled to a computer that is integrated with the system, coupled to the system, otherwise networked to the system, or a combination thereof. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein.

What is claimed is:

1. A method for bonding a first silicon part to a second silicon part, comprising:
    arranging the first silicon part and the second silicon part in direct physical contact on a surface in a thermal insulating structure;
    controlling pressure in the thermal insulating structure to a predetermined pressure;
    controlling temperature in the thermal insulating structure to a predetermined temperature using one or more heaters; and
    bonding the first silicon part and the second silicon part during a process period, the bonding including melting outer surfaces of the first and second silicon parts and allowing capillary forces to draw molten silicon from the outer surfaces of the first and second silicon parts into a gap between the first and second silicon parts,
    wherein the predetermined temperature is in a temperature range that is greater than or equal to 1335° C. and less than 1414° C.

2. The method of claim 1, wherein the pressure in the thermal insulating structure is less than 1 Torr.

3. The method of claim 1, wherein the process period is between 10 hours and 50 hours.

4. The method of claim 1, further comprising supplying an inert gas to the thermal insulating structure during the bonding at a pressure less than one atmospheric pressure.

5. The method of claim 1, wherein a bond that is formed between the first silicon part and the second silicon part is capable of withstanding a working temperature during usage that is greater than 580° C.

6. The method of claim 1, wherein a bond that is formed between the first silicon part and the second silicon part is capable of withstanding working temperatures during usage that are greater than 580° C. and less than 1335° C.

7. The method of claim 1, further comprising supplying an external force to hold the first silicon part to the second silicon part during the bonding.

8. The method of claim 7, wherein the external force is supplied by one of a press and a weight.

9. The method of claim 8, further comprising arranging a carbon material between one of the press and the weight and at least one of the first silicon part and the second silicon part.

10. The method of claim 1, wherein a bond that is formed between the first silicon part and the second silicon part has a thermal conductivity of 1.17+/−0.09 W/cm-K.

11. The method of claim 1, wherein a bond that is formed between the first silicon part and the second silicon part has a tensile strength is greater than 2000 PSI.

12. The method of claim 1, further comprising arranging a carbon material between a weight or a press and at least one of the first silicon part and the second silicon part.

13. The method of claim 12, wherein the carbon material is selected from a group consisting of graphite and grafoil.

14. The method of claim 1, wherein the first silicon part and the second silicon part are bonded together without using an intervening bonding material.

15. The method of claim 1, wherein a bond that is formed between the first silicon part and the second silicon part is a silicon-silicon covalent bond.

16. The method of claim 1, wherein the first silicon part and the second silicon part are made of single crystalline silicon.

17. The method of claim 1, wherein the first silicon part and the second silicon part are made of multi-crystalline silicon.

18. The method of claim 1, wherein the first silicon part and the second silicon part are arranged on a susceptor in the thermal insulating structure.

19. The method of claim 16, wherein the susceptor includes a bottom surface and side walls and wherein the heater is arranged between the side walls and the thermal insulating structure.

20. The method of claim 1 wherein the bonding results in formation of a bond between the first and second silicon parts that:
    does not have weak van der Waals forces, hydrogen bonds, anodic bonds, or adhesive force; and
    does not involve oxygen, hydrogen, or metal as a bonding agent.

21. A method for bonding a first silicon carbide part to a second silicon carbide part, comprising:
    arranging the first silicon carbide part and the second silicon carbide part in direct physical contact in a container;
    surrounding the first silicon carbide part and the second silicon carbide part in a silicon carbide and silicon powder matrix;
    arranging the container in a thermal insulating structure;
    controlling pressure in the thermal insulating structure to a predetermined pressure;
    controlling temperature in the thermal insulating structure to a predetermined temperature using one or more heaters; and
    bonding the first silicon carbide part and the second silicon carbide part during a process period, wherein the predetermined temperature is in a temperature range that is greater than or equal to 1600° C. and less than 2000° C.

22. The method of claim 21, wherein the pressure in the thermal insulating structure is less than 1 Torr.

23. The method of claim 21, wherein the process period is between 10 hours and 50 hours.

24. The method of claim 21, further comprising supplying an inert gas to the thermal insulating structure during the bonding at a pressure less than one atmospheric pressure.

25. The method of claim 21, wherein a bond that is formed between the first silicon carbide part and the second silicon carbide part is capable of withstanding working temperatures during usage that are greater than 580° C. and less than 1600° C.

26. The method of claim 21, wherein the first silicon carbide part and the second silicon carbide part are bonded together without using an intervening bonding material.

27. The method of claim 21, wherein a bond that is formed between the first silicon carbide part and the second silicon carbide part is a Si—C covalent bond.

* * * * *